United States Patent
Nishida

(10) Patent No.: US 7,421,674 B2
(45) Date of Patent: Sep. 2, 2008

(54) APPARATUS AND METHOD FOR ANALYZING POST-LAYOUT TIMING CRITICAL PATHS

(75) Inventor: Katsunori Nishida, Moriyama (JP)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 11/328,708

(22) Filed: Jan. 10, 2006

(65) Prior Publication Data

US 2006/0190884 A1    Aug. 24, 2006

(30) Foreign Application Priority Data

Jan. 17, 2005   (JP) ............................. 2005-009304

(51) Int. Cl.
   *G06F 17/50*   (2006.01)
(52) U.S. Cl. .................................. 716/6; 716/2; 716/4
(58) Field of Classification Search ...................... 716/2, 716/4, 6

See application file for complete search history.

(56) References Cited

U.S. PATENT DOCUMENTS

| | | | | |
|---|---|---|---|---|
| 4,970,664 | A * | 11/1990 | Kaiser et al. ................ | 715/804 |
| 5,636,372 | A * | 6/1997 | Hathaway et al. ........... | 713/500 |
| 6,058,252 | A * | 5/2000 | Noll et al. ..................... | 716/10 |
| 6,249,901 | B1 * | 6/2001 | Yuan et al. ..................... | 716/5 |
| 6,347,074 | B1 * | 2/2002 | Croslin et al. ............... | 370/228 |
| 6,412,096 | B1 * | 6/2002 | Ventrone ....................... | 716/2 |
| 7,194,721 | B1 * | 3/2007 | Slonim et al. ................. | 716/16 |
| 2004/0019450 | A1 * | 1/2004 | Berthold et al. ............. | 702/117 |
| 2004/0019473 | A1 * | 1/2004 | Burden et al. ................. | 703/14 |

FOREIGN PATENT DOCUMENTS

| | | |
|---|---|---|
| JP | 6-282597 | 2/1996 |
| JP | 8-50608 | 2/1996 |

\* cited by examiner

*Primary Examiner*—Jack Chiang
*Assistant Examiner*—Suchin Parihar
(74) *Attorney, Agent, or Firm*—Shimokaji & Associates, P.C.

(57) ABSTRACT

A critical path detecting unit for detecting critical paths for a design in which cells are placed on an integrated circuit and information concerning timing constraints. A representative-critical-path extracting unit extracts a representative critical path by having one critical path represent critical paths which share more intervals than a certain number, and which are similar to one another, out of critical paths which have been detected by the critical path detecting unit. A path-image generating unit renders the representative critical path, which has been extracted by the representative-critical-path extracting unit and reflects information concerning other critical paths, which are similar to the representative critical path, on the representative critical path.

4 Claims, 9 Drawing Sheets

| PATH NUMBER | LIST OF GATE PINS THROUGH WHICH CRITICAL PATH PASSES gatepin1 (START POINT), gatepin2, .... gatepinM, gatepinN (END POINT) |
|---|---|
| 1 | gatepin1_1, gatepin1_2, .... gatepin1_M1, gatepin1_N1 |
| 2 | gatepin2_1, gatepin2_2, .... gatepin2_M2, gatepin2_N2 |
| ⋮ | ⋮ |
| K | gatepinK_1, gatepinK_2, .... gatepinK_MK, gatepinK_NK |

SEGMENTS

| SEGMENT(gatepinM : gatepinN) | FREQUENCY COUNT |
|---|---|
| gatepin1_1 : gatepin1_2 | 1 |
| gatepin1_2 : gatepin1_3 | 2 |
| ⋮ | ⋮ |
| gatepin1_M1 : gatepin1_N1 | 1 |
| gatepin2_2 : gatepin2_3 | 1 |
| gatepin2_3 : gatepin2_4 | 1 |
| ⋮ | ⋮ |
| gatepinK_MK : gatepinK_NK | 1 |

| PATH NUMBER | LIST OF SEGMENTS THROUGH WHICH CRITICAL PATH PASSES |
|---|---|
| 1 | (gatepin1_1, gatepin1_2), (gatepin1_2, gatepin1_3), ...., (gatepin1_M1, gatepin1_N1) |
| 3 | (gatepin3_1, gatepin3_2), (gatepin3_2, gatepin3_3), ...., (gatepin3_M3, gatepin3_N3) |
| 6 | (gatepin6_1, gatepin6_2), (gatepin6_2, gatepin6_3), ...., (gatepin6_M6, gatepin6_N6) |
| 10 | (gatepin10_1, gatepin10_2), (gatepin10_2, gatepin10_3), ...., (gatepin10_M10, gatepin10_N10) |
| 15 | (gatepin15_1, gatepin15_2), (gatepin15_2, gatepin15_3), ...., (gatepin15_M15, gatepin15_N15) |
| ... | ... |

FIG. 10

APPARATUS AND METHOD FOR ANALYZING POST-LAYOUT TIMING CRITICAL PATHS

BACKGROUND OF THE INVENTION

The present invention relates to an apparatus for, and a method of, detecting and displaying a critical path in order to support work for laying out cells and for timing closure in the development of large scale integrated circuits (LSI).

Work for laying out various cells on the chip and for timing closure is a large component in the development of an LSI. Efficiency in this work greatly affects the time needed for development. In general, work which is carried out until work for timing closure is performed in the following procedure.

1. A responsible engineer for logic architecture of an LSI prepares a netlist of the design.
2. An engineer responsible lays out macro cells, including an input/output (I/O) cell, a hard core, a static random access memory (SRAM), and a register array on the chip by means of manual operation on the basis of a floor plan of the entire chip.
3. A layout tool to be executed by a computer lays out other gates (basic cells), which are included in the aforementioned netlist, on the chip while pursuing optimization of timings and wiring.
4. The layout tool to be executed by the computer executes a timing job for design data obtained after the cells are placed, and outputs a timing report (end-point report or the like) of each path (signal-propagating path). The path is a route through which a signal propagates. The path started at a pin of a gate (usually a clock pin of a latch) which is termed as a start point, passes through some pins of gates halfway, and ends at a pin (a data pin of a usual latch) of a gate which is termed as an end point.
5. The engineer responsible for the layout refers to an output result of the fourth step. The engineer responsible for the layout thereby analyzes, and identifies, a cause of having a path (a critical path) through which a signal was unable to propagate in a provided timing (a signal was not propagated in time).
6. If the cause of the critical path is found in the floor plan by the analysis in the fifth step, the work returns to the third step, where the floor plan is modified. In a case where the cause is that the path is logically too deep, the work returns to the first step, where the netlist is altered. If it is found that a simple alteration can meet the timing constrains, the work proceeds to the ensuing process (descriptions is omitted).

The analysis of the critical path by the engineer responsible for the layout in the fifth step can be carried out by means of referring to end-point reports which have been made in the fourth step and an image obtained by overlaying the critical path with the chip which has been displayed on a display. This image can be created by means of detecting the critical path from the timing reports such as the end-point reports.

There have been techniques proposed by others of causing a computer to automatically execute a timing job as described in the fourth step to find a critical path as well as a technique of displaying a critical path in a visible manner. For example, the technique of finding a critical path is disclosed in Japanese Patent Laid-open Official Gazette No. Hei. 6-282597. In another example the technique of displaying a critical path is disclosed in Japanese Patent Laid-open Official Gazette No. Hei. 8-50608.

As described above, the technique of detecting, and visibly displaying, a critical path by use of a computer has been heretofore realized in order to analyze the critical path in the development of an LSI.

However, in a case where there are many critical paths (for example, hundreds of critical paths) in an initial stage or the like of the layout work, if the detected critical paths are displayed one by one, it requires a lot of time and labor to analyze the displayed critical paths.

On the other hand, if all of the detected critical paths are displayed at a time, the critical paths are so crowded on the display screen that it is difficult to identify each of the critical paths visibly.

SUMMARY OF THE INVENTION

With regard to critical paths detected from data on a design of an LSI, it is therefore an object of the present invention to provide a method and system of rendering, and displaying, a plurality of critical paths in a form that it is easy to identify them all at a time, and to accordingly improve efficiency in work for analyzing the critical paths.

In order to achieve the aforementioned object, an aspect of the present invention is carried out as a signal-propagating-path rendering apparatus to be configured in the following manner. This device includes a critical-path detecting unit, a representative-critical-path extracting unit and a path-image generating unit. The critical-path detecting unit detects critical paths on the basis of data concerning a design, in which cells are placed on a chip of a semiconductor integrated circuit and information on timing constraint on the chip. The representative-critical-path extracting unit extracts a representative critical path by having a single critical path represent critical paths, which share more intervals than a certain number, and which are similar to one another, out of the critical paths which have been detected by the critical-path detecting unit. The path-image generating unit renders the representative critical paths, which have been extracted by the representative-critical-path extracting unit, while reflecting, on the representative critical path, information concerning other critical paths which are similar to the representative critical path.

More specifically, this representative critical path extracting unit may extract, as a representative critical path, a critical path through which a signal propagates slowest with respect to predetermined timing conditions among the critical paths similar to one another. In addition, the representative critical path extracting unit may divide each of the critical paths into segments, each of which segments represents an interval between each two adjacent gate pins out of a plurality of gate pins through which the critical path passes from the start point through the end point.

Then the representative critical path extracting unit may count the number of critical paths which pass through each of the segments. Subsequently, the path-image generating unit may render the segments of each of the representative critical paths by use of lines of thicknesses different from one anther in accordance with the numbers counted by the representative-critical-path extracting unit. In addition, the path-image generating unit may render the representative critical paths respectively by use of lines of different colors.

Furthermore, the path-image generating unit may display a path number assigned to each of the rendered representative critical paths, in the same color as the line representing the representative critical path corresponding to the path number, in the vicinity of a line representing the representative critical path and in an appropriate location on a display screen. Moreover, the path-image generating unit may render marks representing the start and end points of each of the representative critical paths in respective locations of the start and end points of the representative critical path which has been rendered.

In addition, the aforementioned signal-propagating-path rendering apparatus can be configured as follows. This apparatus includes critical-path detecting means and representative-critical-path rendering means. The critical-path detecting means detects critical paths. The representative-critical-path display means extracts, and renders a representative critical path by having one path represent critical paths which share more intervals than a certain number and which are similar to one another, out of the critical paths which have been detected by the critical-path detecting means.

In addition, another aspect of the present invention to achieve the aforementioned object is realized as a method of causing a computer to render a signal-propagating path of a semiconductor integrated circuit. This method includes a step of causing a computer to detect critical paths on the basis of data concerning a design in which cells are placed on a chip of a semiconductor integrated circuit, and information concerning timing constraint on the chip, a step of causing the computer to read out the critical paths, and to extract a representative critical path by having one path represent critical paths which more intervals longer than a certain number, and which are similar to one another, out of the critical paths, and a step of causing the computer to render the representative critical path while reflecting, on the representative critical path, information concerning other critical paths which are similar to the representative critical paths.

The other aspect of the present invention is implemented as a program product for causing a computer to function as the aforementioned signal-propagating-path rendering apparatus by controlling the computer, or as a program causing a computer to execute a process corresponding to each step in the aforementioned method of rendering a signal-propagating path. This program can be provided by means of distributing the program in the form of being stored in a magnetic disk unit, optical disk, semiconductor memory, or another recording medium, or by means of delivering the program through a network.

BRIEF DESCRIPTION OF THE DRAWINGS

For a more complete understanding of the present invention and the advantages thereof, reference is now made to the following description taken in conjunction with the accompanying drawings.

FIG. 10 is a diagram showing an example of a structure of a representative critical path table used in this embodiment.

DETAILED DESCRIPTION OF THE PREFERRED EMBODIMENT

The following detailed descriptions will be provided for the best mode (hereinafter referred to as an "embodiment") for carrying out the present invention.

Figure 1:
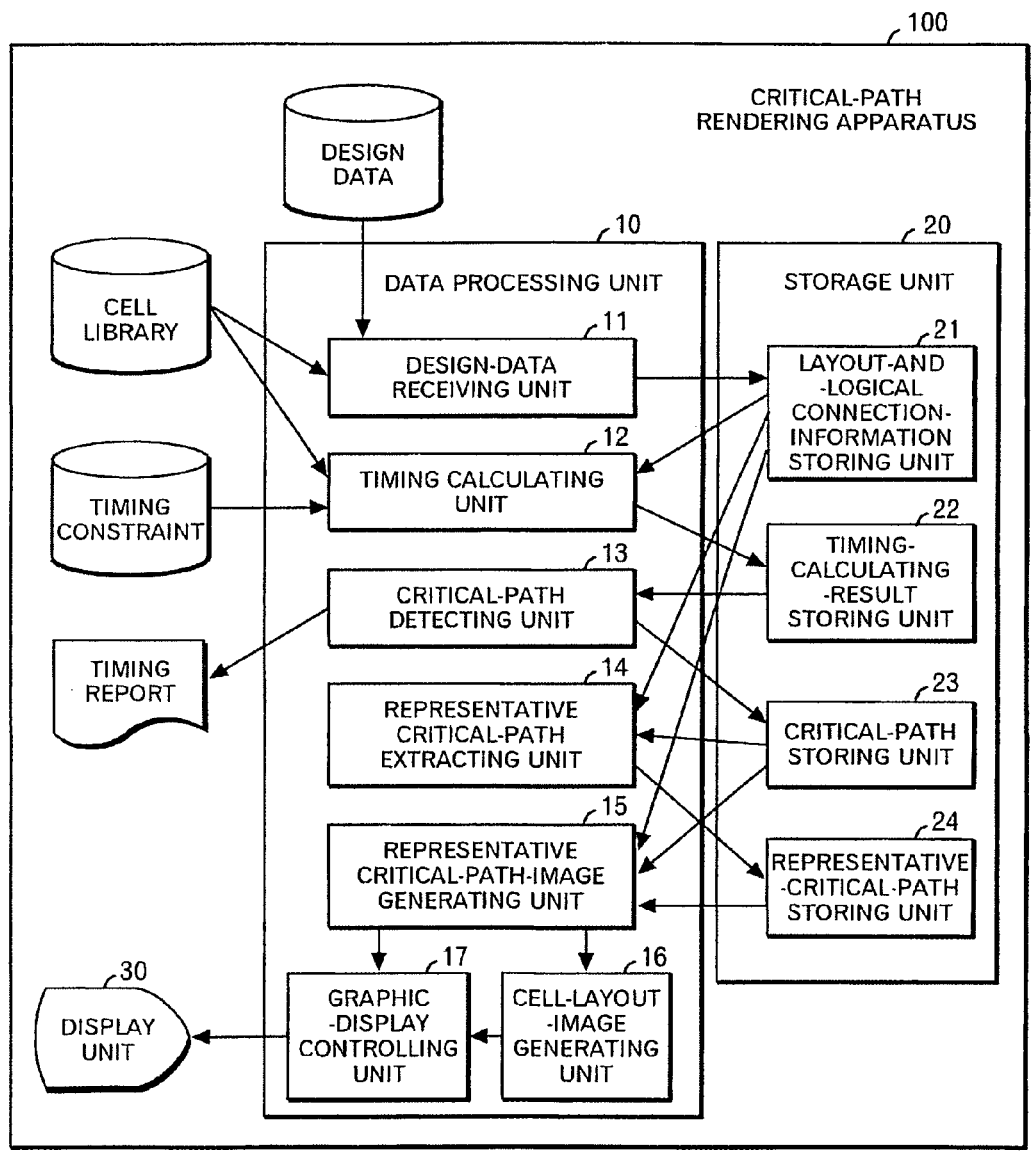
FIG. 1 is a diagram showing a functional configuration of a critical-path rendering apparatus according to this embodiment.

FIG. 1 is a diagram showing a functional configuration of a critical-path rendering apparatus according to this embodiment. The critical-path rendering apparatus 100 shown in FIG. 1 includes a data processing unit 10, a storage unit 20 and a display unit 30. The data processing unit 10 executes various calculation processes. The storage unit 20 stores data which has been used, and generated, for the execution of processes by the data processing unit 10. The display unit 30 displays an image generated by the data processing unit 10. This critical-path rendering apparatus 100 is realized by use of a personal computer, work station, or another computer system.

Figures 2, 3:
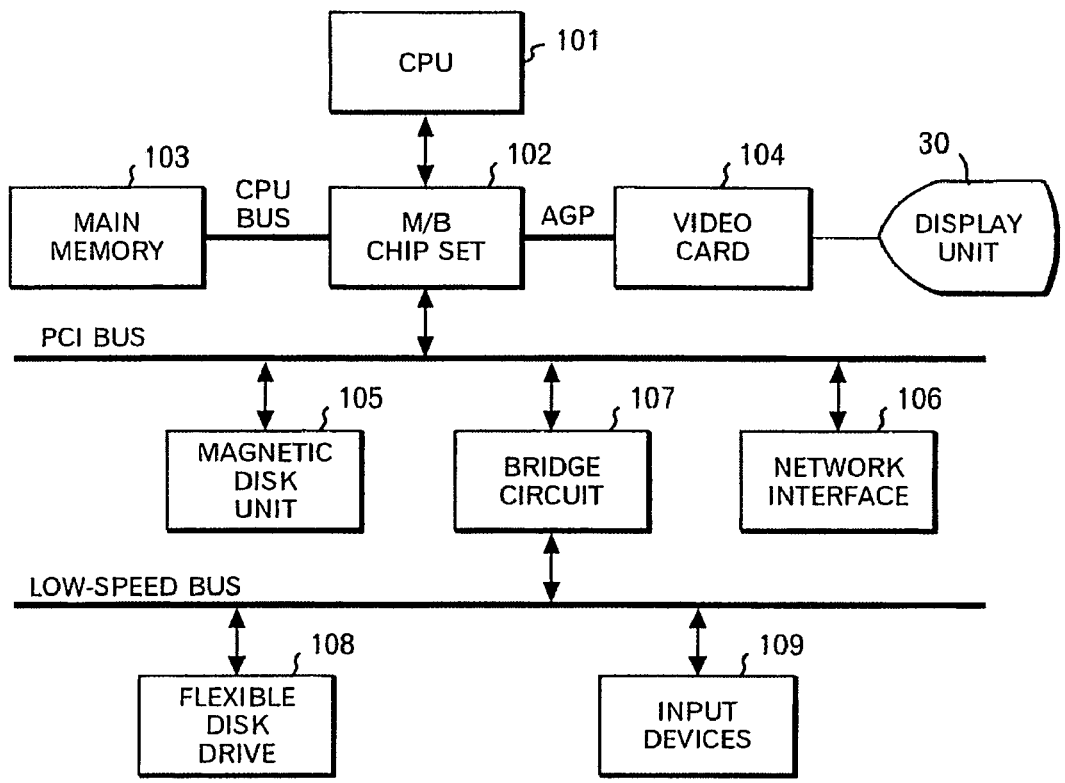
FIG. 2 is a diagram schematically showing an example of a hardware configuration of a computer suitable for realizing the critical-path rendering apparatus shown in FIG. 1.
FIG. 3 is a diagram showing an example of a structure of data to be stored in a critical-path storing unit according to this embodiment.

FIG. 2 is a diagram schematically showing an example of a hardware configuration of a computer suitable for realizing the critical-path rendering apparatus 100 shown in FIG. 1. The computer shown in FIG. 2 includes a central processing unit (CPU) 101, a main memory 103, a video card 104, a magnetic disk unit (HDD) 105, a network interface 106, a flexible disk drive 108 and input devices 109. The CPU 101 is calculation means. The main memory 103 is connected to the CPU 101 through a mother board (M/B) chip set 102 and a CPU bus.

The video card 104 is connected to the CPU 101 through the M/B chip set 102 and an accelerated graphics port (AGP). The magnetic disk unit 105 is connected to the M/B chip set 102 through a peripheral component interconnect (PCI) bus. The flexible disk drive 108 is connected to the M/B chip set 102 through the PCI bus, a bridge circuit 107, and a low-speed bus such as an industry standard architecture (ISA) bus. The input devices 109 include a keyboard and a mouth. In addition, the display unit 30 is connected to the video card 104.

It should be noted that FIG. 2 merely illustrates one hardware configuration of a computer by which this embodiment is carried out. Other various configurations can be adopted as long as they can be applied to this embodiment. For example, a configuration may be adopted, which includes only the video memory instead of the video card 104, and which thereby causes the CPU 101 to process image data. As an external memory, a drive such as a compact disc recordable (CD-R) or a digital versatile disk random access memory (DVD-RAM) may be provided to the computer through an interface such as an attachment (ATA) or a small computer system interface (SCSI).

The data processing unit 10 in the critical-path rendering apparatus 100 shown in FIG. 1 includes a design-data receiving unit 11, a timing calculating unit 12 and a critical-path detecting unit 13. Moreover, the data processing unit 10 further includes a representative-critical-path extracting unit 14 and a representative-critical-path-image generating unit 15.

The representative-critical-path extracting unit 14 extracts representative critical paths, which will be described later, from critical paths which have been detected.

The representative-critical-path-image generating unit 15 generates the representative critical paths thus extracted. Furthermore, the data processing unit 10 includes a cell-layout-image generating unit 16 and a graphic-display controlling unit 17. The cell-layout-image generating unit 16 generates an image showing conditions in which cells are placed, on the basis of information on the layout of cells on the chip. The graphic-display controlling unit 17 combines and displays images, which have been generated respectively by the representative-critical-path-image generating unit 15 and the cell-layout-image generating unit 16 on the display unit 30.

The storage unit 20 is realized, for example, by use of the main memory 103 shown in FIG. 2. The storage unit 20 includes a layout-and-logical-connection-information storing unit 21, a timing-calculating-result storing unit 22, a critical-path storing unit 23 and a representative-critical-path storing unit 24. These storing units store data which has been obtained by processes to be performed respectively by the design-data receiving unit 11, the timing calculating unit 12 in the data processing unit 10, the critical-path detecting unit 13 and the representative-critical-path extracting unit 14 in the course of processes by the data processing unit 10.

Data on design of a chip which is a target to be designed (data on which cells are placed on the chip by the layout tool), information on timing constraint (clock definition, input-output conditions and the like based on a specification of the chip) and a cell library (physical information on cells, information on timings of the cells which are placed on the chip) are stored into the data processing unit 10. These pieces of information may be stored, for example, in the magnetic disk unit 105 shown in FIG. 2, and may be read out to the data processing unit 10, when the process is performed. Alternatively, these pieces of information may be inputted to the data processing unit 10 from an external apparatus.

The design-data receiving unit 11 in the data processing unit 10 is realized, for example, by use of the program-controlled CPU 101 and the main memory 103, which are shown in FIG. 2. This design-data receiving unit 11 receives the data on the design of the chip which is the target to be designed, and receives, from the cell library, information on the cells which is included in the design data. Subsequently, the design-data receiving unit 11 analyzes the design data on the basis of the information obtained form the cell library, and acquires the information on the layout of the cells on the chip and the information on logical connections between each two of the cells. The information on the layout and the information on the logical connections, which have been obtained, are stored into the layout-and-logical-connection-information storing unit 21 in the storage unit 20.

The timing calculating unit 12 is realized, for example, by use of the program controlled CPU 101 and the main memory 103, which are shown in FIG. 2. This timing calculating unit 12 reads out the information on the layout of the cells and the information on the logical connections between each two of the cells, which are stored in the layout-and-logical-connection-information storing unit 21. In addition, the timing calculating unit 12 receives information on relevant cells from the cell library, and receives the information on the timing constraint on the chip which is to be designed. Subsequently the timing calculating unit 12 calculates timings of the paths connecting the cells on the chip. The result of calculating the timing of each of the paths is stored in the timing-calculating-result storing unit 22 in the storage unit 20.

The critical-path detecting unit 13 is realized, for example, by use of the programs-controlled CPU 101 and the main memory 103, which are shown in FIG. 2. The critical-path detecting unit 13 receives the result of calculation of the timing of each of the paths from the timing-calculating-result storing unit 22, and detects critical paths which are out of the respective predetermined timings. In addition, the critical-path detecting unit 13 can create and output a timing report, such as an end-point report, of each of the paths including a critical path. The information on the critical paths which has been detected by the critical-path detecting unit 13 is stored in the critical-path storing unit 23 in the storage unit 20.

FIG. 3 is a diagram showing an example of a structure of data to be stored in the critical-path storing unit 23. A table is stored in the critical-path storing unit 23. In the table, path numbers for identifying the critical paths respectively and lists of gate pins through which the critical paths pass are registered, as shown in FIG. 3. A number assigned to each of the critical paths while the end-point report is being created can be used as the path number.

The design-data receiving unit 11, the timing calculating unit 12 and the critical-path detecting unit 13 can be configured by use of a conventional system of causing a computer to detect critical paths for design data. Means for extracting the representative critical paths out of the detected critical paths, and means for rendering and displaying on the display device 30, a plurality of representative critical paths are included in this embodiment.

The representative-critical-path extracting unit 14 is realized, for example, by use of the program-controlled CPU 101 and the main memory 103, which are shown in FIG. 2. This representative-critical-path extracting unit 14 reads out the information on the critical paths from the critical-path storing unit 23, and then extracts the representative critical paths out of the critical paths.

In general, in the initial stage of development of an LSI, hundreds to thousands of critical paths are present after the layout work. In many cases however, a plurality of critical paths share a common interval. The plurality of paths which share this common interval are termed as being similar to one another.

Figure 4:
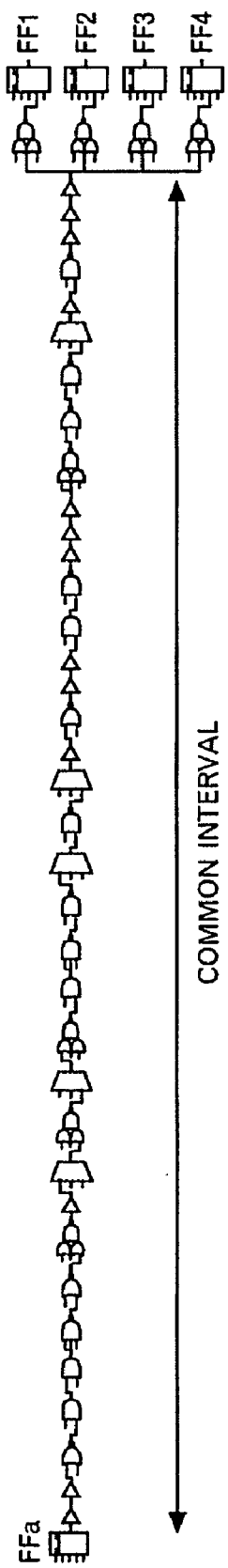
FIG. 4 is a diagram showing an example of a plurality of critical paths which are similar to one another in this embodiment.

As shown in FIG. 4, for example, an interval from a latch FFa at the start point to the last but one buffer before the end points FF1, FF2, FF3 and FF4 is the common interval which four critical paths (FFa-FF1, FFa-FF2, FFa-FF3 and FFa-FF4) share. In many cases, a common interval shared by a plurality of critical paths similar to one another may be a cause which makes signals passing through the plurality of critical paths out of a predetermined timing. With this taken into consideration, a critical path is selected out of the plurality of critical paths similar to one another.

Thereby, the critical path thus selected is extracted as a representative critical path, and the other similar critical paths are disregarded. Accordingly, this makes it possible to significantly decrease the number of critical paths, which are to be displayed and analyzed. In the case shown in FIG. 4, for example, the path FFa-FF1 is selected as the representative critical path, and the other paths FFa-FF2, FFa-FF3 and FFa-FF4 are disregarded. Thereby, the number of paths which are to be analyzed is reduced to a quarter of the original four critical paths.

Based on the aforementioned concept, the representative-critical-path extracting unit 14 extracts a representative critical path out of critical paths which have been detected by the critical-path detecting unit 13. Information on the representative critical path thus detected is stored in the representative-critical-path storing unit 24 in the storage unit 20. It should be noted that descriptions will be provided later for a specific method of detecting a representative critical path, and for details of information to be stored in the representative-critical-path storing unit 24.

The representative-critical-path-image generating unit 15 is realized, for example, by use of the program-controlled CPU 101, the main memory 103 and the video card 104, which are shown in FIG. 2. This representative-critical-path-image generating unit 15 reads out the layout information on the cells, which are placed on the chip and the information on the logical connections from the layout-and-logical-connection-information storing unit 21.

In addition, the representative-critical-path-image generating unit 15 reads out the information on the critical paths from the critical-path storing unit 23, and reads out the information on each of the representative critical paths from the representative-critical-path storing unit 24. Based on these pieces of information, the representative-critical-path-image generating unit 15 generates data on an image to be displayed on the display unit 30. Descriptions will be provided later for details of the method of generating the image data.

Figure 5:
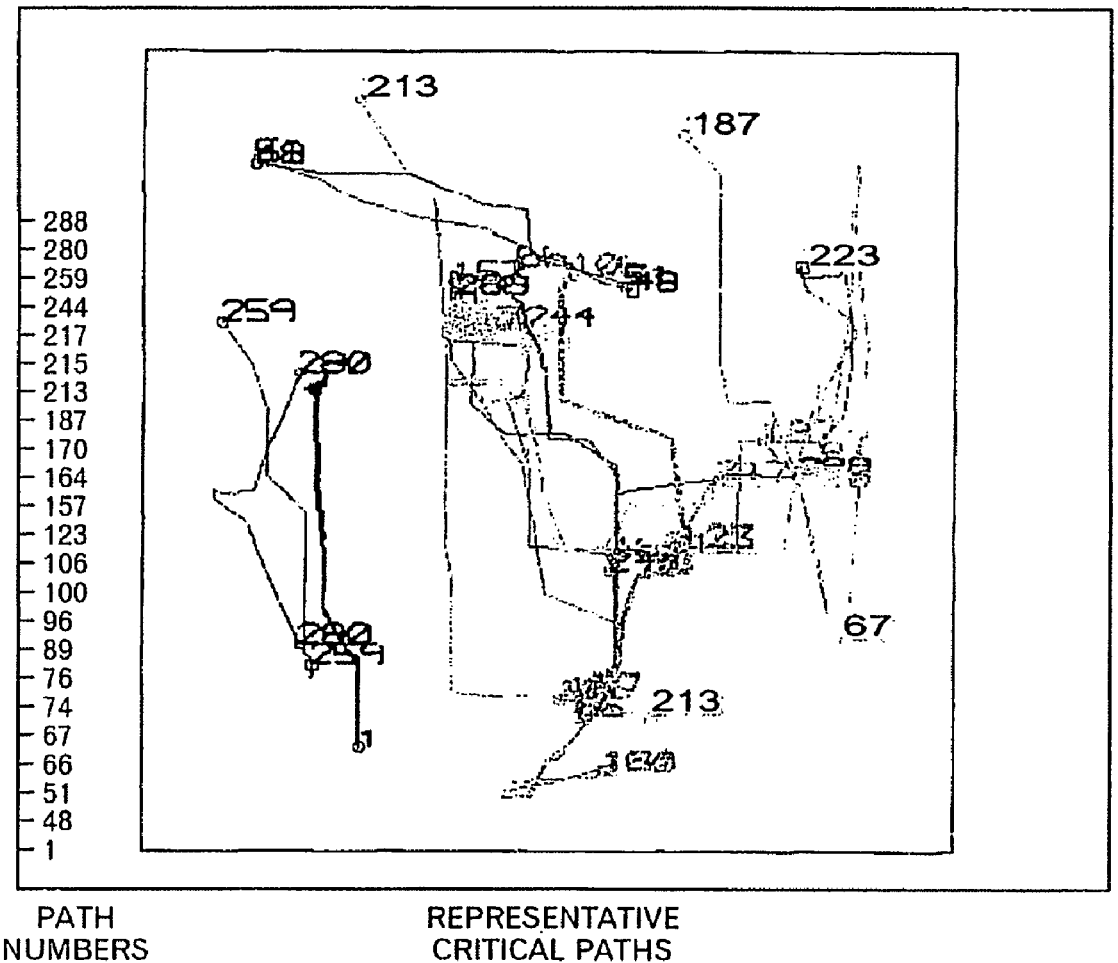
FIG. 5 is a diagram showing an example of a displayed image of representative critical paths generated by a representative-critical-path-image generating unit according to this embodiment.

FIG. 5 is a diagram showing an example of a displayed image of the representative critical paths, which is generated by the representative-critical-path-image generating unit 15. In the image shown in FIG. 5, each of the representative critical paths is shown by use of a line representing the location of the representative critical path on the chip and by use of a number assigned to the line.

The plurality of lines are displayed by use of the respective different colors in order that the lines can be identified to tell which line represents which critical path even if the plurality of lines cross with one another. In addition, in the left margin of the screen, the path numbers are listed up with the same colors as the representative critical paths are shown. Furthermore, the thickness of each of the lines shows how many critical paths each of the representative critical paths represents. In other words, the larger the number of critical paths sharing a common interval is, the thicker a displayed line is.

The cell-layout-image generating unit 16 is realized, for example, by use of the program-controlled CPU 101, the main memory 103 and the video card 104, which are shown in FIG. 2. This cell-layout-image generating unit 16 reads out the layout information on the cells which are placed on the chip and the information on the logical connections from the layout-and-logical-connection-information storing unit 21. On the basis of the information thus read out, this cell-layout-image generating unit 16 generates data on an image of the chip on which the various cells are placed.

Figure 6:
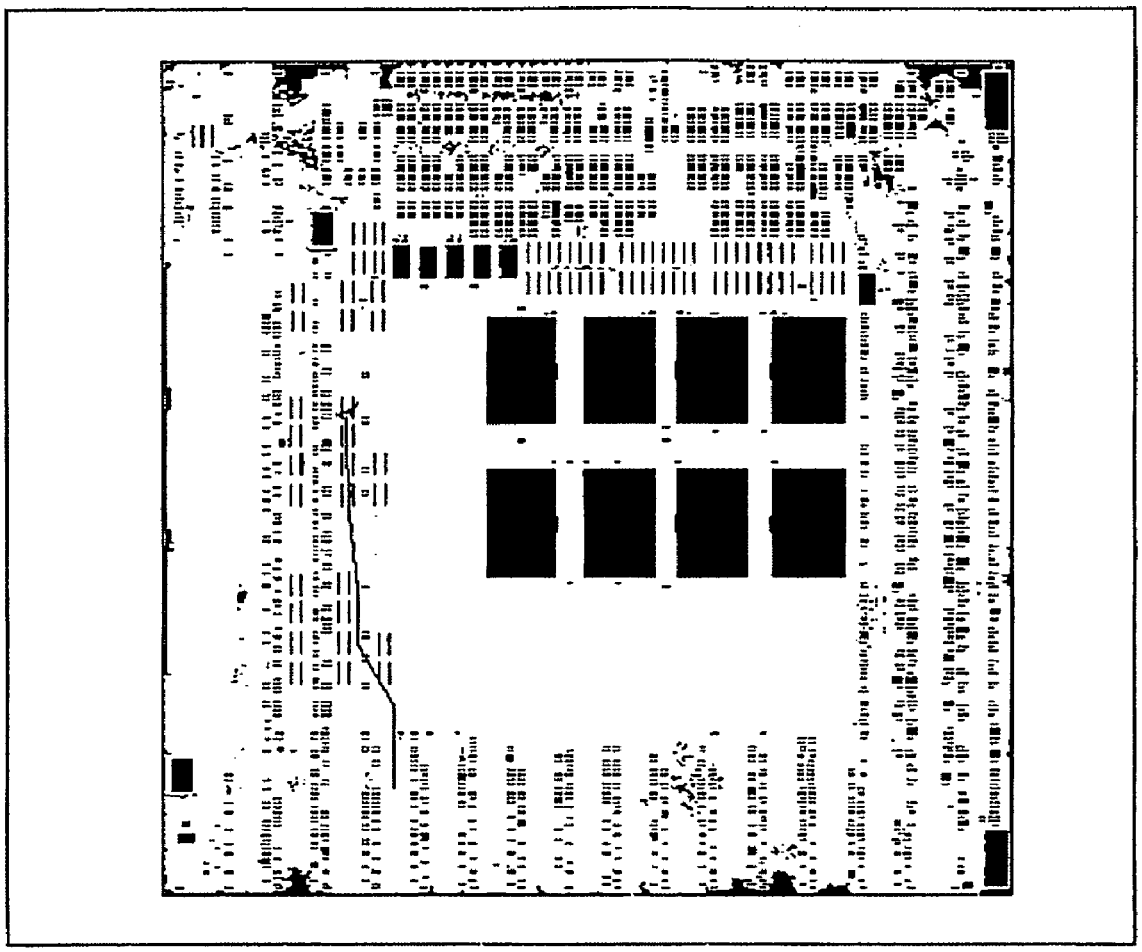
FIG. 6 is a diagram showing an example of a displayed image generated by a cell-layout-image generating unit according to this embodiment.

FIG. 6 is a diagram showing an example of a displayed image to be generated by the cell-layout-image generating unit 16. The generation of the data on the image of the chip on which the cells are placed is carried out by use of the conventional technique. Accordingly, the cell-layout-image generating unit 16 can be configured by use of the conventional system.

The graphic-display controlling unit 17 is realized, for example, by use of the video card 104 shown in FIG. 2. This graphic-display controlling unit 17 combines an image as shown in FIG. 5 which is generated by the representative-critical-path-image generating unit 15 and an image as shown in FIG. 6 which is generated by the cell-layout-image generating unit 16. This graphic-display controlling unit 17 displays the image thus composed on the display unit 30.

Figure 7:
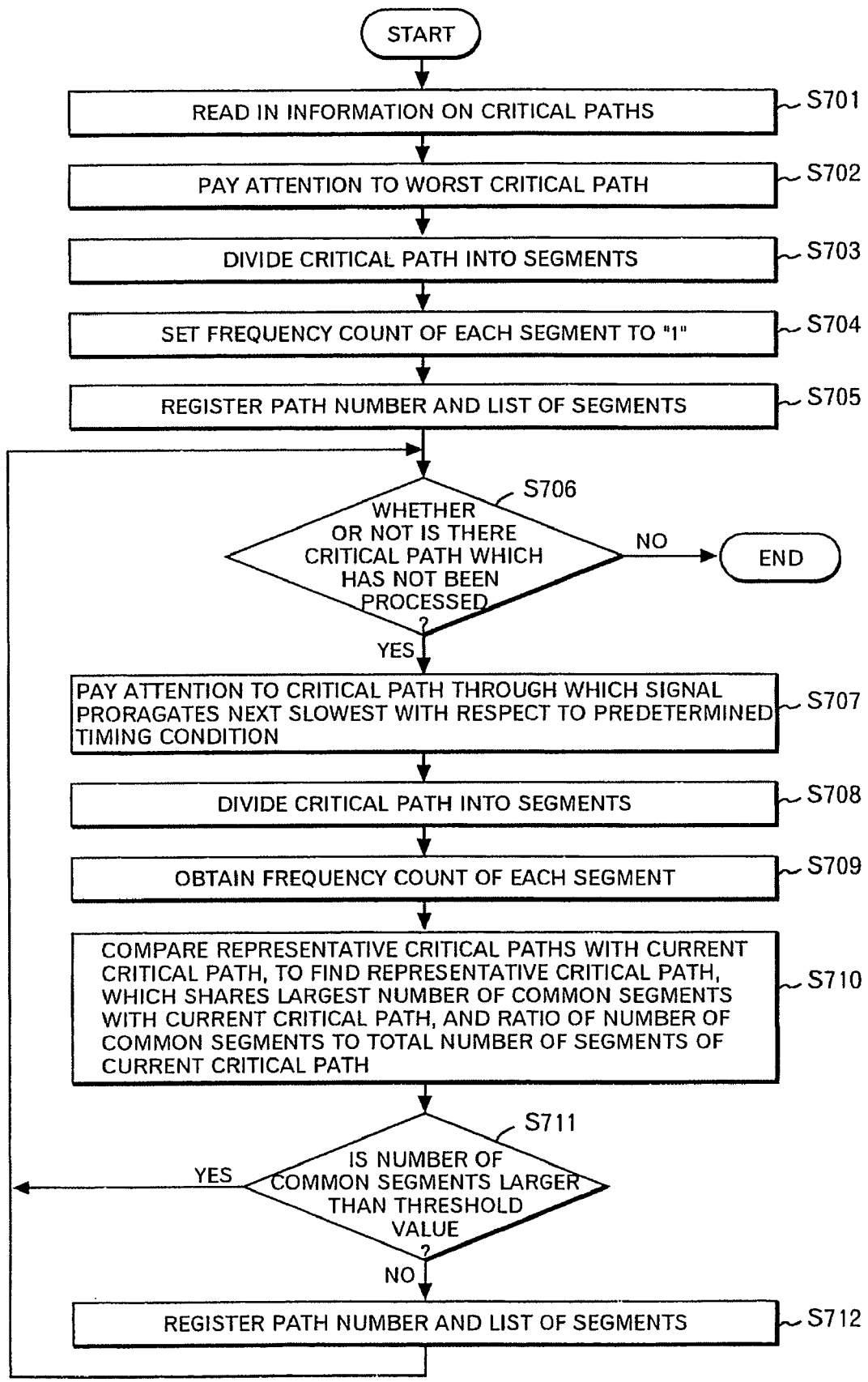
FIG. 7 is a flowchart describing an operation of a representative-critical-path extracting unit according to this embodiment.

Respective detailed descriptions will now be given for operations of the representative-critical-path extracting unit 14 and the representative-critical-path-image generating unit 15 provided by this embodiment. FIG. 7 is a flowchart describing the operation of the representative-critical-path extracting unit 14.

As shown in FIG. 7, the representative-critical-path extracting unit 14 reads in information on all of the critical paths (the path numbers and the lists of the gate pins through which the paths pass) from the critical-path storing unit 23 (in step S701). Subsequently, based on the information thus read in, the representative-critical-path extracting unit 14 pays attention to a path (the worst critical path) through which a signal propagates slowest with respect to predetermined timing conditions among the critical paths (in step S702). Incidentally, this worst critical path corresponds to the first path in the end-point report.

Figures 8, 9:
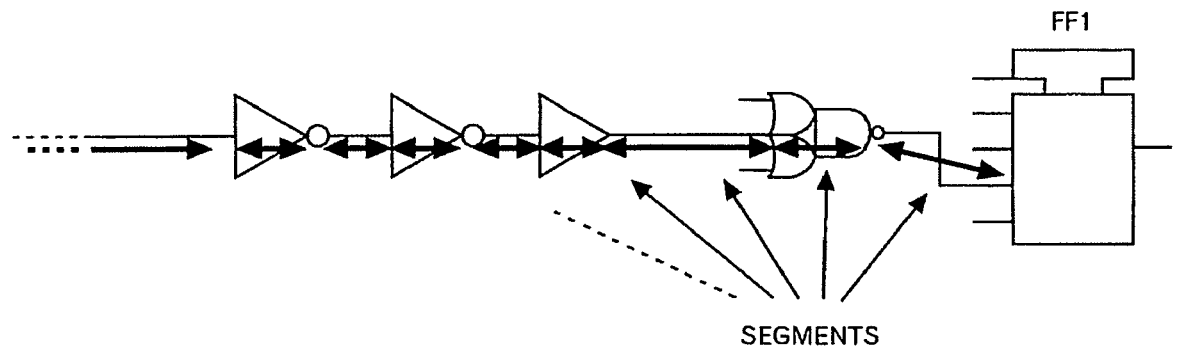
FIG. 8 is a diagram describing segments in a path.
FIG. 9 is a diagram showing an example of a structure of a segment-frequency count table used in this embodiment.

The representative-critical-path extracting unit 14 then divides each of the critical paths into segments (in step S703). A frequency count (variable) of each segment is set to "1" (in step S704). Each of the segments represents an interval between each two adjacent gate pins out of a plurality of gate pins through which a path passes from the start point through the end point, as shown in FIG. 8. The frequency count of each segment is used to count the number of critical paths passing through the segment. The frequency for each segment is used for determining the thickness of the line to be rendered later. The information on these segments and the information on the frequency counts are registered in a segment-frequency count table, which will be described later, and are stored in the representative-critical-path storing unit 24.

Thereafter, the representative-critical-path extracting unit 14 registers, in a representative critical path table, a path number of the worst critical path to which attention was paid and a list of segments through which this path passes. Then the representative-critical-path extracting unit 14 stores the path number and the list in the representative critical path storing unit 24 (in step S705). The worst critical path is a critical path to which attention is paid first among the critical paths. Since the worst critical path is compared with no other critical paths, the worst critical path is always selected as a representative critical path.

Subsequently, the representative-critical-path extracting unit 14 pays attention to a path through which a signal propagates second slowest with respect to the predetermined timing conditions among the critical paths (in steps S706 and S707). Hereinafter, a critical path to which attention is paid is termed as a current critical path. Then the representative-critical-path extracting unit 14 divides the current critical path into segments (in step S708), and obtains the frequency count of each of the segments (in step S709). In other words, attention is paid sequentially to the segments thus divided. In the case of a segment which appears the first time, the frequency count of the segment is set to "1" in the segment-frequency count table. On the other hand, in the case of a segment which has already appeared, one (1) is added to the value of the frequency count which has already been registered in the table.

FIG. 9 is a diagram showing an example of a structure of the segment-frequency count table. As shown in FIG. 9, segments constituting each of the representative critical paths and their respective frequency counts are registered in the segment-frequency count table. In the table shown in FIG. 9, a segment gatepin2_2:gatepin2_3 of a critical path whose path number is 2 is the same as a segment gatepin1_2:gatepin1_3 of a critical path whose path number is 1. For this reason, a value of the frequency number of the segment gatepin1_2:gatepin1_3 is "2."

Then the representative-critical-path extracting unit 14 pays attention sequentially to representative critical paths which have so far been registered in the representative critical path table, and compares segments belonging to each of the representative critical paths with segments through which the current critical path passes. Thereby, the representative-critical-path extracting unit 14 finds a representative critical path which shares the largest number of common segments with the current critical path, and a ratio of the number of the common segments to the total number of segments of the current critical path (in step S710).

For example, it is supposed that the total number of segments of the current critical path is 10, and that the number of segments common to the current critical path and a representative critical path A, B, and C registered in the representative critical path table so far is 0, 4, and 1 respectively. The representative critical path which shares the largest number of common segments with the current critical path is the representative critical path B, and the ratio is 0.4 (four tenths).

Next the representative-critical-path extracting unit 14 regards the current critical path as similar to the representative critical path which shares the largest number of common segments in a case where the ratio found in step S710 is larger than a predetermined threshold value (for example, 0.7) (in step S711). A current critical path which is determined to be similar to the representative critical paths is not registered in the representative critical path table. On the other hand, in a case where the ration found in step S710 is not larger than the predetermined threshold value, the current critical path is regarded as being not similar to the representative critical paths which have so far been registered in the representative critical path table. The current critical path is registered, as a new representative critical path, in the representative critical path table (in steps S711 and S712).

Subsequently, the representative-critical-path extracting unit 14 returns to step S706, and pays attention to a critical path through which the signal propagates next slowest with respect to predetermined timing conditions among the critical paths (in step S707). The representative-critical-path extracting unit 14 repeats the operations to be carried out in and after step S708. Thereafter, if no critical path which has not been processed is left, the process is terminated (in step S706).

In this manner, representative critical paths are extracted in this embodiment in a way that the process is performed in order from the critical path through which the signal propagates slowest with respect to predetermined timing conditions. For this reason, a path which is extracted as the representative critical path means a critical path through which the signal propagates slowest with respect to predetermined timing conditions among the similar critical paths.

Through the aforementioned operations, the segment-frequency count table and the representative critical path table are generated, and are stored in the representative-critical-path storing unit 24.

FIG. 10 is a diagram showing an example of a structure of the representative critical path table. As shown in FIG. 10, path numbers of the representative critical paths and lists of segments through which the representative critical paths pass are registered in the representative critical path table.

Figure 11:
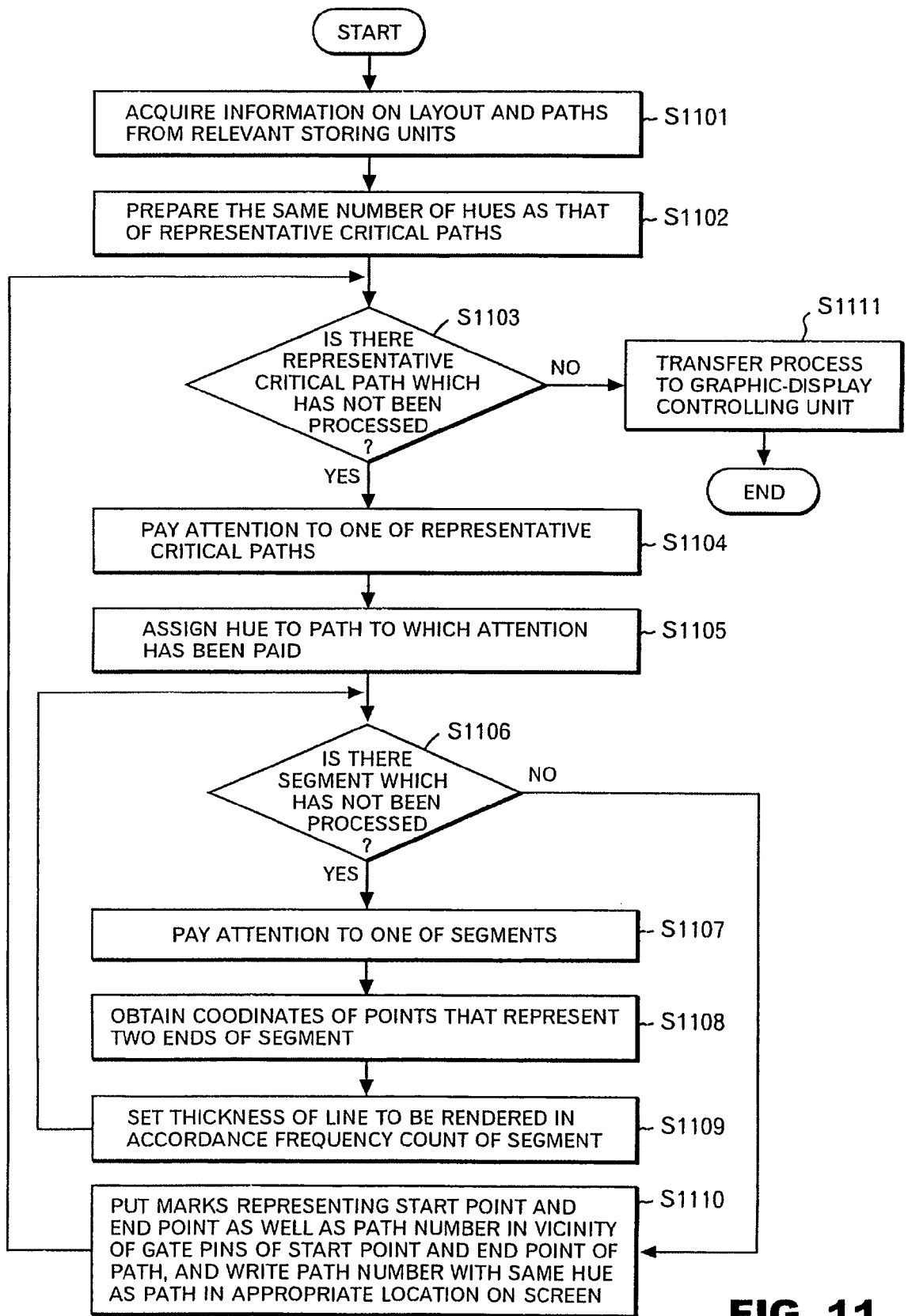
FIG. 11 is a flowchart describing a rendering operation by a representative-critical-path-image generating unit used in this embodiment.

FIG. 11 is a flowchart describing a rendering operation to be carried out by the representative-critical-path-image generating unit 15. As shown in FIG. 11, the representative-critical-path-image generating unit 15 acquires information from the layout-and-logical-connection-information storing unit 21, the critical-path storing unit 23 and the representative-critical-path storing unit 24 (in step S1101). Then, the representative-critical-path-image generating unit 15 prepares the same number of hues as the number of representative critical paths that to be rendered (namely, the same number as that of the representative critical paths that are registered in the representative critical path table) (in step S1102).

Subsequently, the representative-critical-path-image generating unit 15 pays attention to one of the representative critical paths (in steps S1103 and S1104). Hereinafter, an attended representative critical path to which attention has been paid is termed as a current representative critical path. Then, one of the hues which have been prepared in step S1102 is assigned to the current representative critical path (in step S1105).

Thereafter, the representative-critical-path-image generating unit 15 pays attention to one of the segments belonging to the current representative critical path (in steps S1106 and S1107). Subsequently, the representative-critical-path-image generating unit 15 obtains coordinates on a layout screen of points that represent the gate pins at the two ends of the segment to which attention has been paid (in step S1108). The representative-critical-path-image generating unit 15 sets the thickness of a line to be rendered in accordance with a value of the frequency count of this segment. The thickness of this line can be set by means of associating, for example, a square root of the frequency number with the thickness of the line (the number of dots).

After the process from step S1107 through step S1109 is performed for all of the segments of the current representative critical path (in step S1106), the representative-critical-path-image generating unit 15 subsequently obtains coordinates of the points that represent gate pins of the start point and the end point of the current representative critical path respectively. Thus, the representative-critical-path-image generating unit 15 puts marks representing the start point and the end point as well as the path number in predetermined locations in the vicinity of the respective points in the system of coordinates. Then, the path number is written by use of a hue assigned in step S1105 in a location outside the chip on the layout screen (for example, in the left margin on the screen)(in step S1110).

Incidentally, the marks representing the start point and the end point of each of the representative critical paths on the layout screen should be marks different from each other in order that the start point and the end point can be identified. For example, each of the marks should be of a size large enough to be visible, the start point should be represented by a squared mark, and the end point should be represented by a circled mark. This is because it is important to decide which extreme point is the start point (or the end point) when the critical path is recognized visibly.

Next, the representative-critical-path-image generating unit 15 returns to step S1103, and pays attention to one of the representative critical paths which have not yet been processed (in step S1104). Then the representative-critical-path-image generating unit 15 repeats the operations to be carried out in and after step S1105. Thereafter, if no critical path which has not been processed is left, the process is turned over to the graphic-display controlling unit 17, and is terminated (in steps S1103 and S1111). The graphic-display controlling unit 17 acquires the image data which has been generated by the representative-critical-path-image generating unit 15 and the image data on the chip on which the cells are placed, which image data has been generated by the cell-layout-image generating unit 16. Then the graphic-display controlling unit 17 combines the two pieces of image data, and displays the image thus combined on the display unit 30.

In the aforementioned manner, the representative critical paths are displayed on the display unit 30. This means that the number of paths to be displayed is decreased to a large extent in comparison with a case where all of the critical paths are displayed. On the other hand, the critical paths to be analyzed can be displayed with a smaller number of screens in comparison with a case where all of the critical paths are displayed one after another. Furthermore, in a case where there are other critical paths which are similar to the representative critical paths (which share common intervals with the representative critical paths), the number of the critical paths is reflected on the thickness of each of the paths to be displayed on the screen. This makes it possible to grasp the critical paths visibly.

Accordingly, this makes it possible to provide an image where the critical paths are highly visible, and which is highly convenient, for users (an engineer responsible for the layout and an engineer responsible for the logic design) to analyze the representative critical paths. This makes it possible to contribute to improving efficiency in the work. It should be noted that the representative critical paths may be rendered by means of changing brightness and saturation of the colors other than the hues, although the representative critical paths are rendered by means of assigning different hues respectively to the representative critical paths in the case of the aforementioned examples of the operations.

It should be noted that critical paths are displayed on the screen, the intervals of the critical paths which are not common intervals shared with the representative critical paths but are a cause which makes signals propagate through the critical paths out of a predetermined timing. This is because other critical paths similar to the representative critical paths are excluded from a target of analysis. However, in general, in the step of designing an LSI, the critical paths are detected and analyzed several times by modifying the floor plans and altering the netlist on a case-by-case basis. For this reason, the critical paths which have been not displayed on the screen will become a target of analysis, through further repeating the operation of detecting and displaying the representative critical paths by means of this embodiment. No problem is therefore caused.

In the case of the present invention configured in the aforementioned manner, the number of paths to be displayed can be decreased, and a highly-visible layout image can be rendered and displayed, by means of extracting representative critical paths from critical paths which have been detected by using data concerning design of an LSI and preventing other paths from being displayed. In addition, each of the representative critical paths may be rendered by use of a line of thickness which is different in accordance with the number of paths similar to the representative critical path. A plurality of representative critical paths may be rendered in different colors. Path numbers may also be displayed. These make it easy to identify displayed critical paths, and accordingly contribute to improving efficiency in the analysis work.

Although the preferred embodiment of the present invention has been described in detail, it should be understood that various changes, substitutions and alternations can be made therein without departing from spirit and scope of the inventions as defined by the appended claims.

What is claimed is:

1. A signal propagating path rendering method which causes a computer to render a signal propagating path of a semiconductor integrated circuit, the method comprising:
   a first step wherein the computer detects a critical path based on design data in which cells are disposed on a chip of a semiconductor integrated circuit and timing constraint information on the chip, and stores the critical paths in a memory device;
   a second step wherein the computer reads out a critical path from the memory to extract a representative critical path to represent with a single path the mutually similar paths that share more than a predetermined number of intervals in the paths; and
   a third step wherein the computer reads out a representative critical path from the memory, and renders the representative critical path, incorporating other critical path data similar to each representative critical path.

2. A signal-propagating path rendering method according to claim 1, wherein, in the second step:
   the computer extracts, as a representative critical path, the path wherein the signal propagation is slowest, from the predetermined timing conditions, among the mutually similar critical paths.

3. A signal-propagating path rendering method according to claim 1, wherein, it in the third step:
   the computer renders a representative critical path using lines of differing thicknesses in accordance with the numbers of similar other critical paths.

4. A signal-propagating path rendering method according to claim 1, wherein:
   in the second step, the computer divides a critical path into segments that are intervals between each two adjacent gate pins, out of a plurality of gate pins through which a path passes from the start point through the end point, and counts the number of critical paths passing through the segment; and
   in the third step, the computer renders individual segments of the representative critical path using lines of differing thicknesses in accordance with the values counted in the second step.

* * * * *